United States Patent
Yamada (10) Patent No.: US 6,767,822 B2
(45) Date of Patent: Jul. 27, 2004

(54) METHOD OF FORMING METALLIC FILM AND METHOD OF PRODUCING SEMICONDUCTOR SYSTEM

(75) Inventor: Hiroshi Yamada, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/312,478

(22) PCT Filed: Apr. 9, 2002

(86) PCT No.: PCT/JP02/03550

§ 371 (c)(1),
(2), (4) Date: Apr. 9, 2002

(87) PCT Pub. No.: WO02/089194

PCT Pub. Date: Nov. 7, 2002

(65) Prior Publication Data

US 2003/0148607 A1 Aug. 7, 2003

(30) Foreign Application Priority Data

Apr. 23, 2001 (JP) ........................................ 2001-123968

(51) Int. Cl.$^7$ ..................... H01L 21/4763; H01L 21/302
(52) U.S. Cl. ....................... 438/622; 438/625; 438/629; 438/692
(58) Field of Search ............................... 438/622, 675, 438/677, 625, 629, 692

(56) References Cited

U.S. PATENT DOCUMENTS

| | | | | |
|---|---|---|---|---|
| 3,911,819 A | * | 10/1975 | Pryor et al. ................. | 428/652 |
| 3,977,913 A | * | 8/1976 | Cabo et al. .................. | 148/681 |
| RE28,964 E | * | 9/1976 | Nunes et al. ................ | 148/610 |
| 4,014,716 A | * | 3/1977 | Cabo et al. .................. | 148/563 |
| 4,109,374 A | * | 8/1978 | Whetstone et al. ........... | 29/599 |
| 4,123,923 A | * | 11/1978 | Bako .............................. | 70/74 |
| 4,612,166 A | * | 9/1986 | Brock et al. ................. | 420/470 |
| 4,728,372 A | * | 3/1988 | Caron et al. ................. | 148/554 |
| 5,089,057 A | * | 2/1992 | Plewes ......................... | 148/685 |
| 5,495,737 A | | 3/1996 | Graham | |
| 5,601,665 A | * | 2/1997 | Caron et al. ................. | 148/554 |
| 5,834,374 A | | 11/1998 | Cabral | |
| 5,853,505 A | * | 12/1998 | Brauer et al. ................ | 148/433 |
| 6,241,831 B1 | * | 6/2001 | Bhargava ..................... | 148/432 |
| 6,344,129 B1 | * | 2/2002 | Rodbell et al. .............. | 205/291 |
| 6,548,395 B1 | * | 4/2003 | Woo et al. ................... | 438/622 |

FOREIGN PATENT DOCUMENTS

| | | |
|---|---|---|
| EP | 0 704 887 | 3/1996 |
| JP | 63-44741 | 2/1988 |
| JP | 01-298744 | 12/1989 |
| JP | 08-158036 | 6/1996 |
| JP | 10-32203 | 2/1998 |
| JP | 2000-252357 | 9/2000 |

* cited by examiner

Primary Examiner—Michael Lebentritt
(74) Attorney, Agent, or Firm—Sonnenschein, Nath & Rosenthal LLP

(57) ABSTRACT

It is contrived to solve the problem of deformation of material due to differences in coefficient of thermal expansion, hardness and the like between a wiring metal and an insulating film surrounding the wiring metal, the problem of generation of voids in the wiring, and the like problems, and to improve initial characteristics and reliability of operation on a long-term basis. A method of producing a semiconductor system comprises the steps of: heating a metallic film to a temperature (B) of the stress yield point of the metal ±50° C. and holding the metallic film at that temperature for a predetermined period of time, and heating the metallic film to a temperature (C) which is not lower than the holding temperature and at which growth of crystal grain diameter occurs to thereby cause growth of crystal grain diameter of the metallic film.

3 Claims, 7 Drawing Sheets

METHOD OF FORMING METALLIC FILM AND METHOD OF PRODUCING SEMICONDUCTOR SYSTEM

TECHNICAL FIELD

The present invention relates to a method of forming a metallic film and a method of producing a semiconductor system, and particularly to a method of forming a metallic film and a method of producing a semiconductor system which are characterized by characteristic features in a heat treatment method.

BACKGROUND ART

Attendant on miniaturization of semiconductor systems, a groove wiring technology has come to be put to practical use. The groove wiring technology is a technology in which copper or a copper alloy is buried as a metallic wiring material in wiring grooves or both wiring grooves and connection holes formed in an insulating film, and thereafter excess portions of the metallic wiring material on the insulating film are removed by chemical mechanical polishing, whereby a groove wiring and/or plugs are formed of the metallic wiring material buried in the wiring grooves or in both the wiring grooves and the connection holes.

However, there has been the problem of deformation of the materials due to the differences between the wiring metal and the insulating film in the surroundings thereof in coefficient of thermal expansion, hardness and the like. In addition, there is also the problem that when the wiring metal itself is heat treated after being processed to a desired shape, thermal expansion and compressive forces from the surroundings cause distortion of crystals or changes in crystal structure, so that voids are generated in the wiring after cooling. These defects in shape degrade initial characteristics and reliability of operation on a long-term basis, such as defects in conduction of the wiring material. Each of copper and the copper alloy constituting the wiring material is formed into a film at a low temperature in order to prevent coagulation in a thin film condition in a sputtering method, and is restricted by the temperature of a plating solution tank in a plating method; in any case, the film of the wiring material is formed at a lower temperature as compared with the subsequent heat treatment. Therefore, the above-mentioned problems are conspicuous.

An example of variation of stress in a metal (for example, copper) surrounded by a material other than metal (for example, an oxide film, an organic insulating film, etc.) due to heating and cooling will be described referring to FIG. 8.

Figure 8:
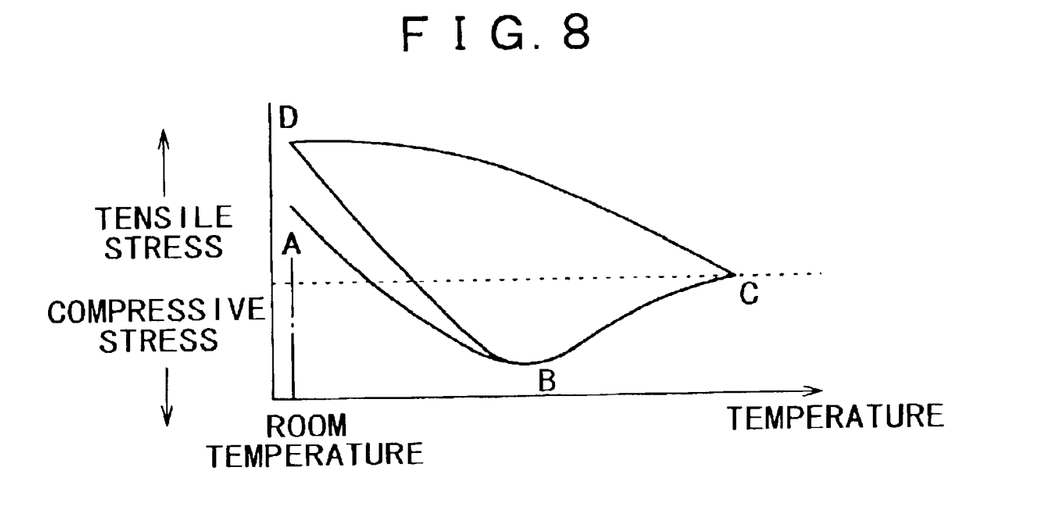
FIG. 8 is a diagram showing the relationship between stress and temperature in a heat treatment, illustrating the problems to be solved.

As shown in FIG. 8, the metal formed without heat treatment has a tensile stress at room temperature (for example, 23° C.) (the condition of A), and upon being heated, the metal comes to have a compressive stress due to thermal expansion, but the metal gradually releases the compressive stress by crystal growth to come to a substantially stress-free condition (the process of transition from B to C). This is called a yield phenomenon. When being cooled, on the contrary, the metal returns to room temperature while relaxing the tensile stress (the condition of D), but the stress at this time is different from that in the initial condition (the condition of A). When the metal is heated for the second time and later, the metal shows a hysteresis change along the same loop as D-B-C-D.

At the time of heating and expansion while a compressive stress is being exerted on the metal in the route B-C, deformations occur in the inside of the metal and the material in contact therewith, which constitutes the above-mentioned problems in heat treatment.

Figure 9:
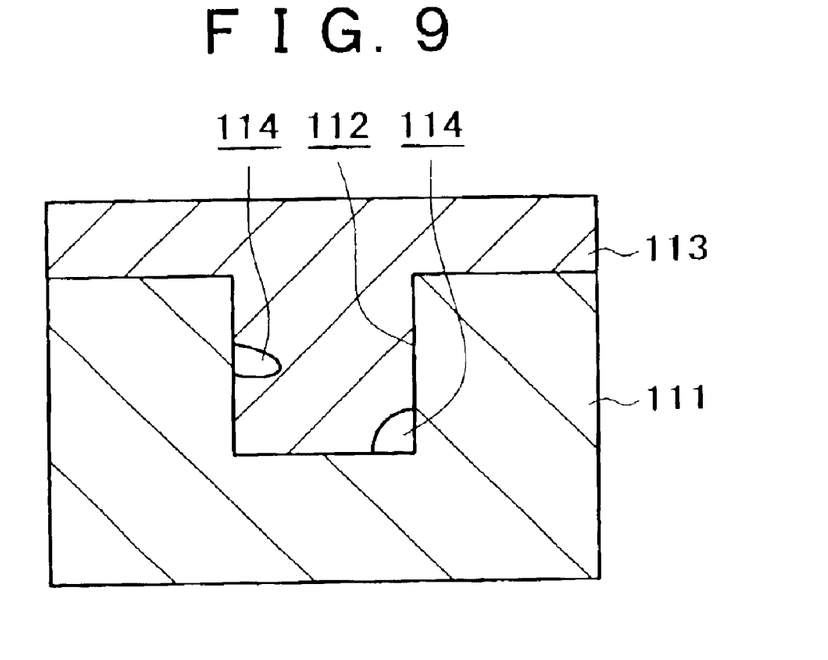
FIG. 9 is a general constitutional sectional view illustrating the problems in heat treatment.

On the other hand, in a production process of a semiconductor system, as shown in FIG. 9, a recessed portion 112 such as a wiring groove or both a wiring groove and connection holes, etc. is processed in a hard material film 111 such as silicon oxide ($SiO_2$), silicon oxyfluoride (SiOF), etc., and then a metallic film 113 for filling up the recessed portion 112 is formed by such technology as sputtering, electrolytic plating, etc. When a heat treatment is conducted thereafter, the metallic film shows thermal expansion and crystal growth while moving upwards, and upon cooling, the tensile stress cannot be resisted, resulting in that voids 114 are generated at a lower portion and side portions of the metallic film 113.

Figure 10:
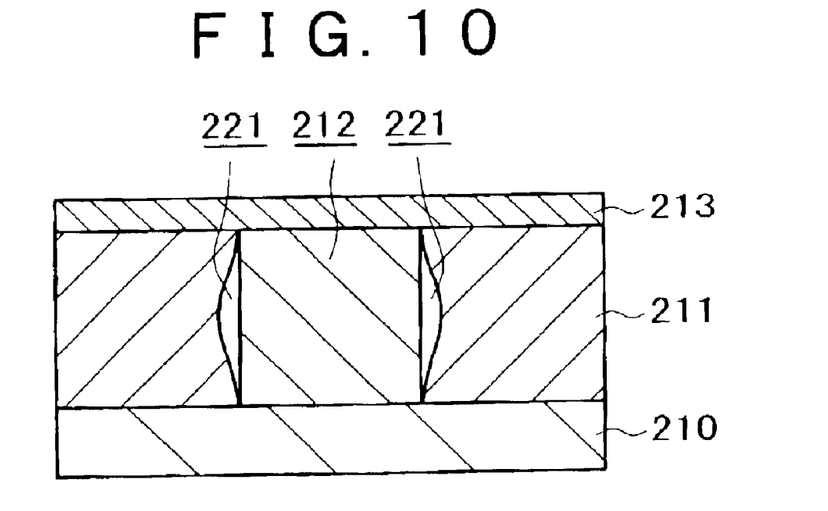
FIG. 10 is a general constitutional sectional view illustrating the problems in heat treatment of a structure comprising an organic insulating film.

In addition, as shown in FIG. 10, in a wiring structure in which an organic low dielectric constant film 211 formed on a substrate 210 is used as an inter-layer insulating film, the upper portion of a metallic wiring 212 formed in the organic low dielectric constant film 211 is covered with a protective film 213, for example, silicon nitride, silicon carbide or the like for preventing oxidation of the metallic wiring 212. There are some cases where such a structure is subjected to a heat treatment.

The organic low dielectric constant film 211 is subjected to a curing heat treatment after the film is formed by a coating system, for example. However, in the process of forming a structure composed of two or more layers, the first layer is reheated at the time of the curing heat treatment of the second layer. At the curing heat treatment temperature, the organic low dielectric constant film 211 is much lowered in hardness, so that it is easily deformed by thermal expansion of the metallic wiring 212 in contact therewith. Upon the subsequent cooling, the metallic wiring 212 shows a contraction, resulting in that voids 221 are generated between the metallic wiring 212 and the organic low dielectric constant film 211.

DISCLOSURE OF INVENTION

The present invention resides in a method of forming a metallic film and a method of producing a semiconductor system invented in order to solve the above-mentioned problems.

The method of forming a metallic film according to the present invention comprises the steps of: heating a metallic film to a temperature of the stress yield point of the metal ±50° C. and holding the metallic film at the temperature for a predetermined period of time, and heating the metallic film to a temperature which is not lower than the holding temperature and at which growth of crystal grain diameter of the metallic film occurs, to thereby cause growth of crystal grain diameter of the metallic film.

According to the method of forming a metallic film, since the method comprises the step of heating the metallic film to a temperature of the stress yield point of the metal ±50° C. and holding the metallic film at the temperature for a predetermined period of time, stress yield of the metallic film is completed in a temperature range in which thermal expansion amount is small. Since the method comprises the subsequent step of heating the metallic film to a temperature which is not lower than the holding temperature of the stress yield point of the metal ±50° C. and at which growth of crystal grain diameter of the metallic film occurs, to thereby cause growth of crystal grain diameter of the metallic film, a heat treatment at a high temperature is conducted under the condition where the crystal of the metallic film is stable.

A first method of producing a semiconductor system according to the present invention comprises the steps of: forming a metallic film to be used for wiring on an insulating film provided with a recessed portion so as to fill up the recessed portion, heating the metallic film to a temperature of the stress yield point of the metal ±50° C. and holding the metallic film at the temperature for a predetermined period of time, and heating the metallic film to a temperature which is not lower than the holding temperature and at which growth of crystal grain diameter of the metallic film occurs, to thereby cause growth of crystal grain diameter of the metallic film.

According to the first method of producing a semiconductor system, since the method comprises the step of heating the metallic film at a temperature of the stress yield point of the metal ±50° C. and holding the metallic film at the temperature for a predetermined period of time, stress yield of the metallic film is completed in a temperature range in which thermal expansion amount is small. Since the method comprises, thereafter, the step of heating the metallic film to a temperature which is not lower than the temperature of the stress yield point of the metal ±50° C. and at which growth of crystal grain diameter of the metallic film occurs, to thereby cause growth of crystal grain diameter of the metallic film, a heat treatment at a high temperature is conducted under the condition where the crystal of the metallic film is stable. Therefore, the generation of voids in the recessed portion upon cooling of the metallic film is suppressed, so that breakage of wiring and the like defects are prevented where the metallic film in the recessed portion is utilized as a wiring or a plug.

A second method of producing a semiconductor system according to the present invention resides in a method of producing a semiconductor system, comprising a step of heat treating a structural body comprising a first material portion which is softened when being heated and a second material portion comprised of a metal based material and formed in contact with the first material portion, wherein the heat treatment is conducted by heating to a temperature lower than the softening point of the first material portion to cause crystal growth of the second material portion with stress yield.

According to the second method of producing a semiconductor system, since the heat treatment by heating to a temperature lower than the softening point of the first material portion to cause crystal growth of the second material portion with stress yield is conducted, deformation of the first material is prevented.

BEST MODE FOR CARRYING OUT THE INVENTION

One embodiment of the method of forming a metallic film according to the present invention will be described referring to FIG. 1.

Figure 1:
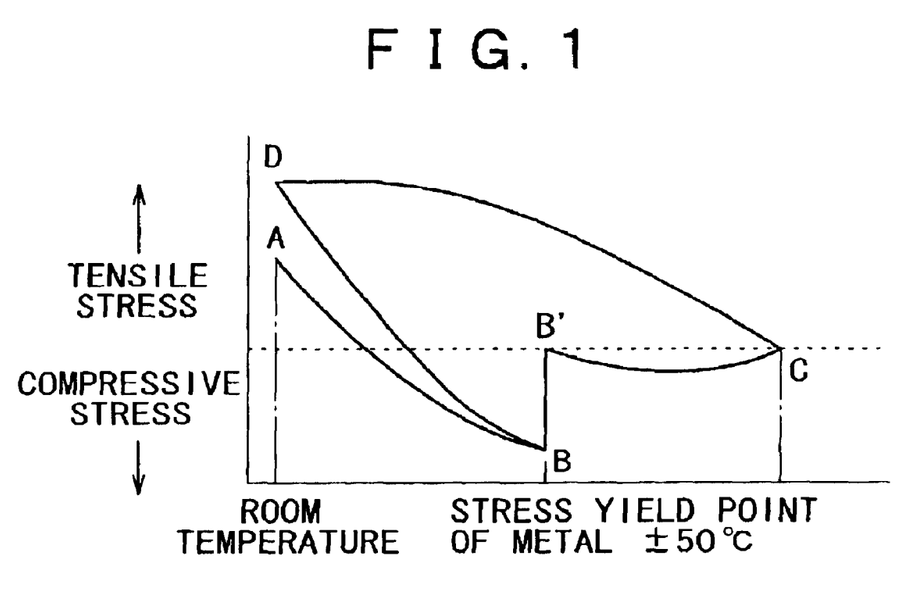
FIG. 1 is a diagram showing the relationship between stress and temperature, illustrating one embodiment of the method of forming a metallic film according to the present invention.

As shown in FIG. 1, a metallic film formed without heat treatment has a tensile stress at room temperature (for example, 23° C.) (the condition of A), and upon being heated, the metallic film comes to have a compressive stress due to thermal expansion (the process of transition from A to B). The temperature at the condition of B is the stress yield point of the metallic film ±50° C.

While the metallic film receives the compressive stress due to heating and expansion, the metallic film is held at the high temperature, whereby stress yield proceeds (the process of transition from B to B'). Namely, the period of time of holding at the temperature of the stress yield point of the metallic film ±50° C. is a period of time over which the metallic film releases the compressive stress to come to a substantially stress-free condition.

Thereafter, the metallic film is heated to a predetermined maximum heating temperature (the condition of C). For example, the metallic film is heated to a temperature at which growth of crystal grain diameter of the metallic film occurs. This heating step can be conducted under the condition where stress is substantially absent. Thus, a heat treatment is conducted at a predetermined temperature after stress yield is completed at a temperature lower than that in the conventional heat treatment.

Incidentally, at the time of cooling, the metallic film returns to room temperature (the condition of D) with generation of tensile stress, and the stress at this time is different from that in the initial condition (the condition of A). At the time of the second or later heating, the metallic film shows a hysteresis change along the same loop as D-B-C-D.

In the above method of forming a metallic film, since the metallic film is heated to the temperature of the stress yield point thereof ±50° C. and held at the temperature for a predetermined period of time, stress yield of the metallic film is completed in a temperature range in which thermal expansion amount is small. Since the metallic film is thereafter heated to a temperature which is not lower than the holding temperature of the stress yield point of the metal ±50° C. and at which growth of crystal grain diameter occurs, the growth of crystal grain diameter of the metallic film occurs under the condition where the stress in the metallic film is stable.

Next, concrete examples in which the maximum heating temperature for causing growth of crystal grain diameter of the metallic film (copper film) is 400° C. and the metallic film, in its course, is held for 1 hr at 250° C., 200° C. and 150° C., in the above method of forming a metallic film, will be described referring to FIGS. 2 to 4. The samples used were each prepared by forming a silicon oxide film on a silicon substrate, and forming sequentially on the surface of the silicon oxide film, a tantalum nitride film of 25 nm in thickness, a copper seed layer of 200 nm in thickness, and a copper plating layer of 1.30 im in thickness. Measurement of stress was carried out in a nitrogen atmosphere at about 1 atm.

Figure 2:
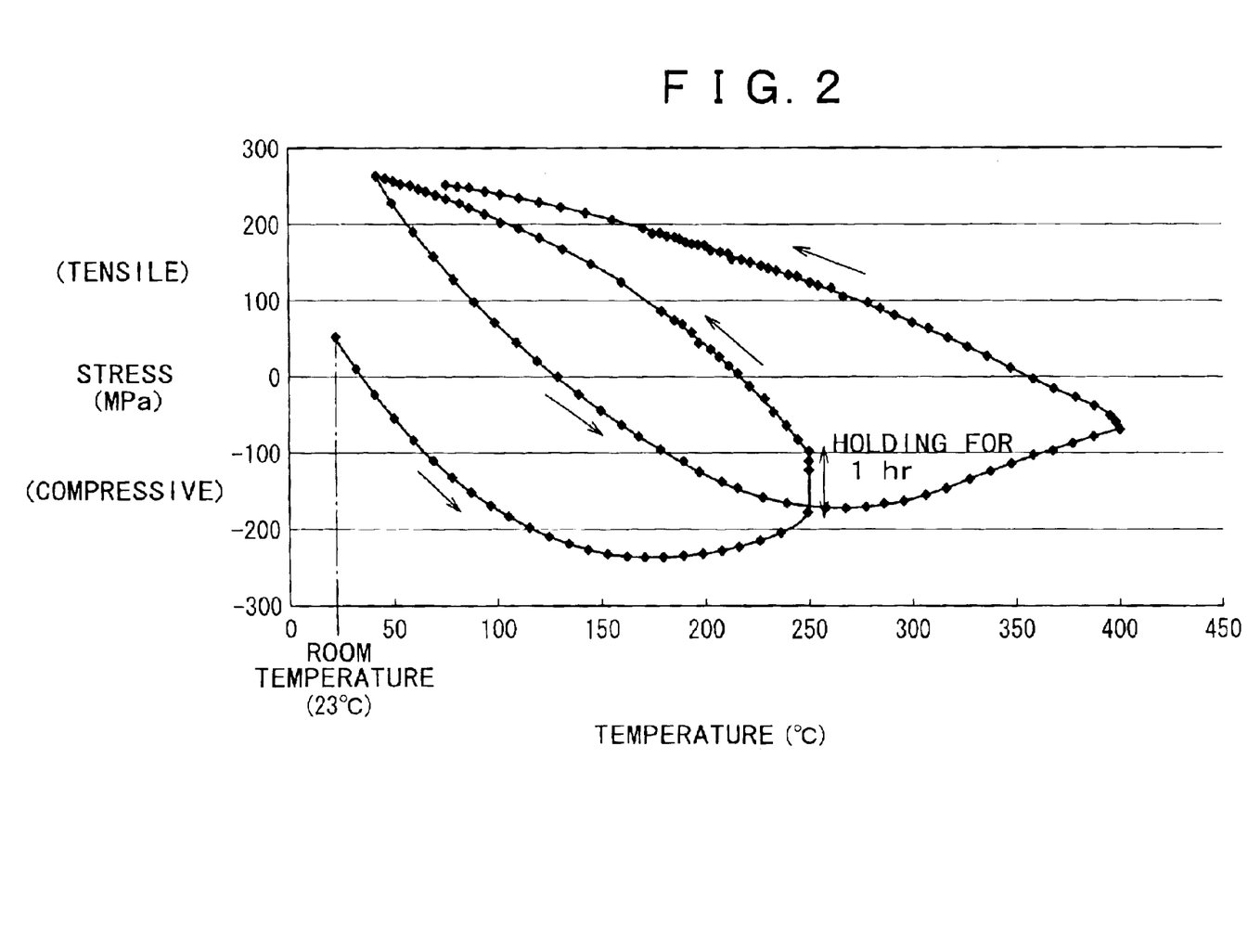
FIG. 2 is a diagram showing the relationship between stress and temperature in a first example.

In the first example, as shown in FIG. 2, the sample is heated from room temperature (23° C.) to 250° C., and is held for 1 hr at that temperature. Thereafter, the sample is cooled, and is again heated. After the sample is heated to 400° C., it is again cooled.

In the first example as above, crystal growth of copper is completed while the sample is heated to 250° C. Then, stress yield is effected by the holding of the sample at 250° C. for 1 hr. Upon the subsequent cooling, a tensile stress of about 265 MPa is exerted on the metallic film, and the value of the tensile stress is higher than the tensile stress at the time when the metallic film is formed. Then, the heating step of heating to 400° C. for causing growth of crystal grain diameter is conducted. In this heating step, the temperature reaches the maximum heating temperature of 400° C. under the condition where compressive stress is not increased. Upon the subsequent cooling, a tensile stress of about 265 MPa is exerted on the metallic film.

Thus, the difference between the tensile stress upon cooling after heating to and holding at 250° C. and the tensile stress upon cooling after heating to 400° C. is substantially zero. Therefore, even if a step of heating, for example, to 400° C. and cooling is again conducted, the stress varies along the same hysteresis loop, so that a stable heat treatment can be achieved. In addition, a strong compressive stress of about 200 MPa would not be exerted at the time of low-temperature heating at about 250° C.

In addition, the sample is heated from room temperature to about 300° C., and held at that temperature for 1 hr. Thereafter, the sample is cooled and is again heated. After the sample is heated to 400° C., it is again cooled. In this case also, the same action as in the first example above is seen. It should be noted here that where the temperature at which the sample is held for 1 hr exceeds 300° C., thermal expansion of the metallic film is so large that a strong compressive stress is generated, which is unfavorable.

In the above method of forming a metallic film, the maximum heating temperature is in the range of 350 to 430° C. The range is set to be not lower than 350° C., for ensuring that sufficient growth of crystal grain diameter can be obtained where copper or a copper alloy is used as the metallic film. The range is set to be not higher than 430° C., for applying this method of forming a metallic film to a process used for an organic insulating film which has a heat resistant temperature (for example, thermal decomposition temperature of the organic insulating film) of about 450° C.

Figure 3:
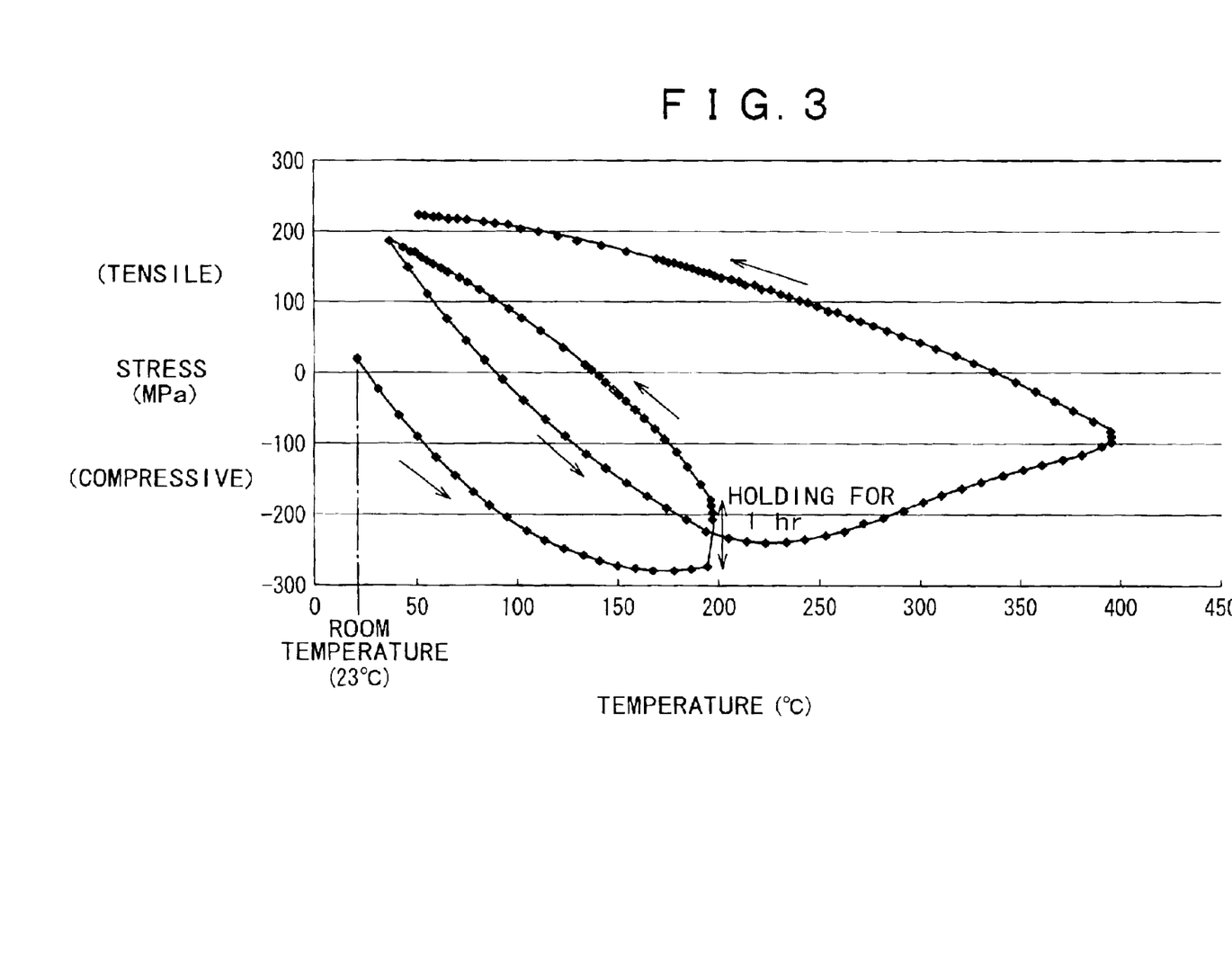
FIG. 3 is a diagram showing the relationship between stress and temperature in a second example.

In the second example, as shown in FIG. 3, the sample is heated from room temperature (23° C.) to 200° C., and is held for 1 hr at that temperature. Thereafter, the sample is cooled, and is again heated. After the sample is heated to 400° C., it is again cooled.

In the case of the second example, crystal growth of copper is substantially completed during the heating to 200° C. Then, stress yield is effected by the holding at 200° C. for 1 hr. Upon the subsequent cooling, a tensile stress of about 185 MPa is exerted on the metallic film, the value being higher than the tensile strength at the time when the metallic film is formed. Next, a heating step of heating to 400° C. for causing growth of crystal grain diameter is conducted. In this heating step, the temperature reaches the maximum heating temperature of 400° C. under the condition where compressive stress is not increased. Upon the subsequent cooling, a tensile stress of about 220 MPa is exerted on the metallic film.

Thus, the different between the tensile stress upon cooling after heating to and holding at 200° C. and the tensile stress upon cooling after heating to 400° C. is about 35 MPa. Therefore, when the sample is again heated, for example, to 400° C. and then cooled, the stress varies along roughly the same hysteresis loop, so that comparatively stable heat treatments can be conducted.

Figure 4:
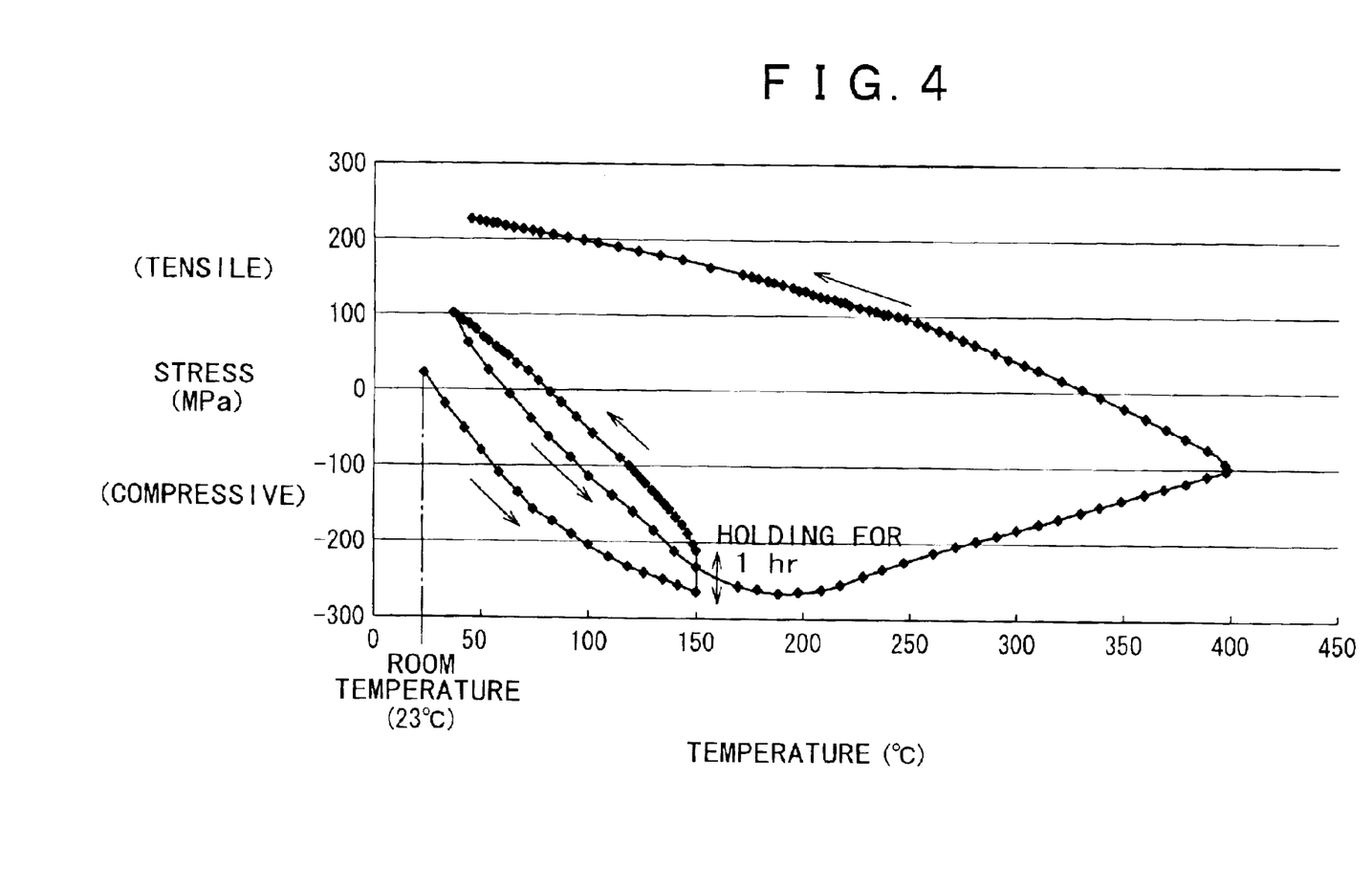
FIG. 4 is a diagram showing the relationship between stress and temperature in a third example.

In the third example, as shown in FIG. 4, the sample is heated from room temperature (23° C.) to 150° C., and is held for 1 hr at that temperature. Thereafter, the sample is cooled and is again heated. After the sample is heated to 400° C., it is again cooled.

In the third example above, the holding at 150° C. for 1 hr causes a certain extent of stress yield, which is not sufficient. In addition, crystal growth of copper is not completed during the heating to 150° C. Besides, when the sample is cooled from 150° C., a tensile stress of about 100 MPa is exerted on the metallic film, the value being higher than the tensile stress at the time when the metallic film is formed. Next, a heating step of heating to 400° C. for causing growth of crystal grain diameter is conducted. In this heating step, stress yield occurs, crystal growth occurs, and growth of crystal grain diameter occurs. Then, the maximum heating temperature of 400° C. is reached. Upon the subsequent heating, a tensile stress of about 220 MPa is exerted on the metallic film.

Thus, the difference between the tensile stress upon cooling after heating to and holding at 150° C. and the tensile stress upon cooling after heating to 400° C. is about 120 MPa. Therefore, when the sample is again heated to 400° C., thermal expansion occurs while a compressive stress is exerted on the metallic film during the heating step.

Accordingly, the temperature to which the metallic film formed is heated and at which the metallic film is held for a predetermined period of time must at least be not less than 200° C., and the upper limit of the temperature is about 300° C. Preferably, the temperataure is in the range of 250 to 300° C. Namely, the heating and holding temperature must be the stress yield point of the metallic film (in the case of copper or a copper alloy) ±50° C.

In the above method of forming a metallic film, the metallic film formed on a flat surface has been described. Here, yield phenomena due to a difference in the formed film condition of metallic films will be described referring to FIGS. 5A and 5B.

Figure 5A:
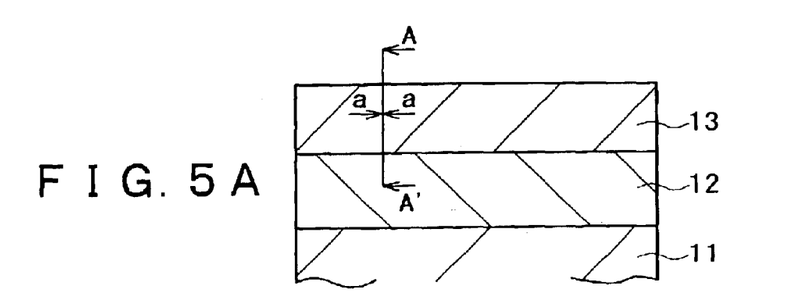
FIGS. 5A and 5B are illustrations of yield phenomena based on a difference in the formed film condition of metallic films.

As shown in FIG. 5A, a silicon oxide film 12 with a uniform thickness is formed on a flat surface of a silicon substrate 11. Where a metallic film 13 of copper, a copper alloy or the like is uniformly formed on such a flat ground, compressive stresses (or tensile stresses) a equivalent in the lateral direction of the figure as viewed in a certain section (section A–A') are generated. When heating is conducted under this condition, the metallic film 13 undergoes thermal expansion, the compressive stress increases, and stress relaxation such as rearrangement of crystals, volume increase in the direction to the opened surface, etc. occurs in a certain temperature range. This is the yield phenomenon.

Figure 5B:
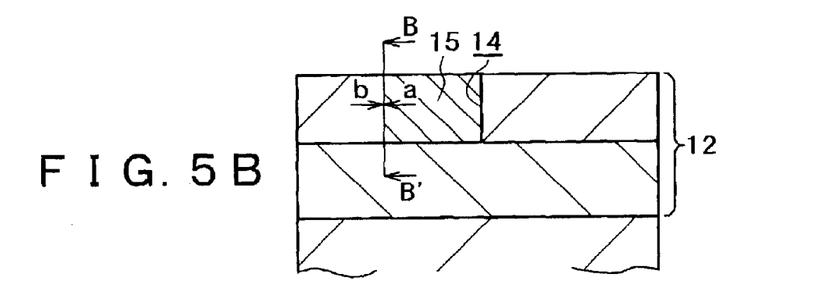

Now, as shown in FIG. 5B, in the case of a metallic wiring 15 of copper, a copper alloy or the like in a groove 14 surrounded by a silicon oxide film 12 or the like (or in a structure of a connection hole), also a compressive stress is generated as viewed at a side surface of the metallic wiring 15 (section B–B') at the time of heating; the stress b with which the surrounding silicon oxide film 12 pushes the metallic wiring 15 depends on the material, but the stress a with which the metallic wiring 15 pushes the surrounding is the same as in the case of a flat film. Whether or not a deformation of the material actually occurs due to the compressive stress depends on the coefficient of thermal expansion and hardness of the material, but the mechanism of generation of the yield phenomenon of the metallic film due to the compressive stress is the same for both the case of the flat film and the case of the groove/hole structure.

Accordingly, the above method of forming a metallic film can be applied to a method of producing a semiconductor system in which an insulating film is provided with a wiring groove or both a wiring groove and connection holes, and a metallic film is formed on the insulating film so as to fill up the wiring groove or both the wiring groove and the connection holes.

Next, as one embodiment of the first method of producing a semiconductor system according to the present invention, an example of applying the above method of forming a metallic film will be described below.

Figure 6A:
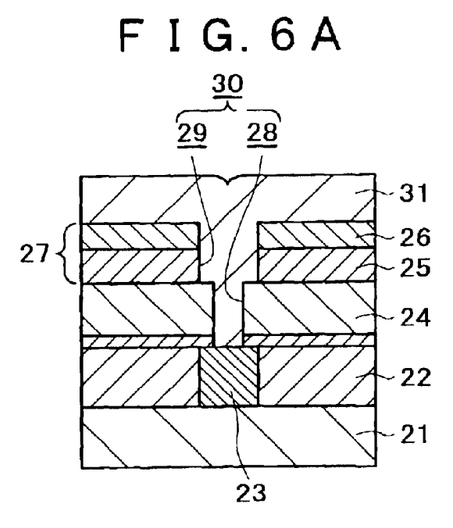
FIGS. 6A and 6B are general constitutional sectional views showing one embodiment of the first method of producing a semiconductor system according to the present invention.

As shown in FIG. 6A, a device (not shown) is formed on a semiconductor substrate 21. The device may be, for example, a transistor, a capacitor, etc. A first insulating film 22 is formed so as to cover the device. For example, a first wiring 23 is formed in the first insulating film 22. A second insulating film 24 formed of silicon oxide and a third insulating film 27 comprised of a low dielectric constant insulating film 25 and a silicon oxide film 26 are formed on the first insulating film 22. The second insulating film 24 is provided with a connection hole 28 reaching the first wiring 23, and the third insulating film 27 is provided with a wiring groove 29 fronting on the connection hole 28. Though not shown, a tantalum nitride film is formed on the inside surfaces of a recessed portion 30 comprised of the wiring groove 29 and the connection hole 28, and further, a copper seed layer is provided.

On the third insulating film 27 provided with the recessed portion 30, a metallic film 31 to be used for wiring is formed by use of copper so as to fill up the recessed portion 30. After the film formation, the metallic film 31 is heated to a temperature of the stress yield point of copper ±50° C., and is held at that temperature for a predetermined period of time. Here, the metallic film 31 was held at 250° C. for 1 hr. Thereafter, the metallic film 31 is heated to a temperature which is not lower than the holding temperature and at which growth of crystal grain diameter occurs, whereby growth of crystal grain diameter of the metallic film 31 is effected. Here, an organic insulating film was used as the low dielectric constant insulating film 25, and therefore, the temperature for growth of crystal grain diameter was set at 400° C. The temperature for growth of crystal grain diameter is set in the range of 350 to 430° C., and it is appropriately selected in the temperature range according to the heat resistant temperature of the organic insulating film.

Figure 6B:
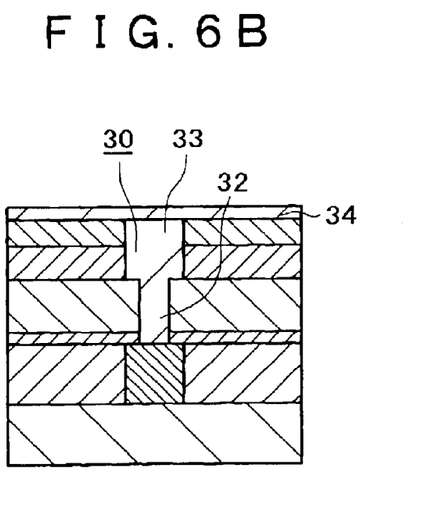

Thereafter, cooling is conducted. Then, excess portions of the metallic film 31, the tantalum nitride film, etc. on the third insulating film 27 are removed, whereby a plug 32 and a second wiring 33 are formed of the metallic film 31 consisting of copper in the recessed portion 30, as shown in FIG. 6B. Thereafter, a silicon nitride film 34 for prevention of oxidation is formed.

According to the first method of producing a semiconductor system as above-described, since the method comprises the step of heating the metallic film 31 to a temperature of the stress yield point of the metal ±50° C. and holding the metallic film 31 at that temperature for a predetermined period of time, stress yield of the metallic film 31 is completed in a temperature range in which thermal expansion amount is small. Since the method comprises, thereafter, the step of heating the metallic film 31 to a temperature which is not lower than the holding temperature of the stress yield point of the metal ±50° C. and at which growth of crystal grain diameter occurs and holding the metallic film 31 at that temperature to thereby cause growth of crystal grain diameter of the metallic film 31, a heat treatment at a high temperature is conducted under the condition where the crystal of the metallic film 31 is stable.

Therefore, the generation of voids in the recessed portion 30 upon cooling of the metallic film 31 is suppressed, so that breakage of wiring or the like defects are prevented where the metallic film 31 in the recessed portion 30 is utilized as the second wiring 33 and the plug 32.

Figure 7:
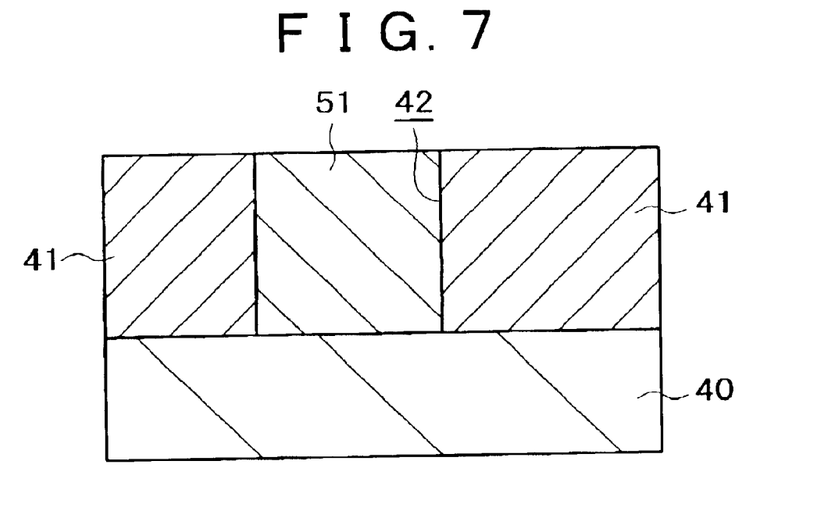
FIG. 7 is a general constitutional sectional view showing one embodiment of the second method of producing a semiconductor system according to the present invention.

Next, one embodiment of the second method of producing a semiconductor system according to the present invention will be described referring to a general constitutional sectional view showing the embodiment.

The method of producing a semiconductor system comprises a step of heat treating a structural body comprising a first material portion 41 such as an organic insulating film which is softened when being heated and a second material portion 51 comprised of a metal based material (for example, copper or a copper alloy) and formed in contact with the first material portion 41, as shown in FIG. 7. The heat treatment is conducted by heating a temperature lower than the softening point of the first material portion 41 to cause crystal growth of the second material portion 51 with stress yield.

For example, the heat treatment is applied to a structure in which the so-called low dielectric constant organic insulating film such as polyaryl ether is used as the first material portion 41 formed on a ground 40, and the second material portion 51 is formed in a recessed portion 42 (for example, a groove or both a groove and a connection hole) formed in the first material portion 41. The heat treatment must cause crystal growth of the second material portion 51 with stress yield, and must be conducted at a temperature lower than the softening point of the first material portion 41. As one example, the heat treatment is conducted at a temperature of 350 to 430° C. Here, the softening point of the polyaryl ether is 430° C., and therefore, the heat treatment is conducted at 400° C. In this heat treatment also, in the same manner as in the first method of producing a semiconductor system, the structure is heated to a temperature of the stress yield point of the second material portion 51 ±50° C., is thereafter held at that temperature, for example, for 1 hr to cause crystal growth and stress yield, and is then heated to 400° C. to cause growth of crystal grain diameter.

In the second method of producing a semiconductor system, since the heat treatment of heating to a temperature (for example, 400° C.) lower than the softening point of the first material portion 41 to cause crystal growth of the second material portion 51 with stress yield is conducted, deformation of the first material portion 41 is prevented. Therefore, the generation of voids in the second material portion 51 is suppressed. In addition, since the crystal growth is completed in the low temperature range (stress yield point ±50° C.) in which thermal expansion amount is small, a strong compressive stress would not be generated even in the subsequent heat treatment in a high temperature range of 400° C. As a result, the generation of voids in the second material portion 51 comprised of the metallic film is suppressed even after cooling.

As has been described above, according to the method of forming a metallic film according to the present invention, the metallic film is heated to a temperature of the stress yield point of the metal ±50° C. and held at the temperature for a predetermined period of time, so that stress yield of the metallic film is completed in a temperature range in which thermal expansion amount is small. Thereafter, the metallic film is heated to a temperature which is not lower than the holding temperature of the stress yield point of the metal ±50° C. and at which growth of crystal grain diameter occurs, to cause growth of crystal grain diameter of the metallic film, so that a heat treatment at a high temperature can be conducted under the condition where the crystal of the metallic film is stable.

According to the first method of producing a semiconductor system according to the present invention, the metallic film is heated to a temperature of the stress yield point of the metal ±50° C. and held at the temperature for a predetermined period of time, so that stress yield of the metallic film can be completed in a temperature range in which thermal expansion amount is small. Thereafter, the metallic film is heated to a temperature which is not lower than the holding temperature of the stress yield point of the metal ±50° C. and at which growth of crystal grain diameter occurs, to cause growth of crystal grain diameter of the metallic film, so that a heat treatment at a high temperature can be conducted under the condition where the crystal of the metallic film is stable. Therefore, the generation of voids in a recessed portion upon cooling of the metallic film can be suppressed, so that breakage of wiring or the like defects can be prevented where the metallic film in the recessed portion is utilized as a wiring and a plug. Accordingly, it is possible to contrive an improvement in initial characteristics and reliability of operation on a long-term basis, such as defects in conduction of the wiring material.

According to the second method of producing a semiconductor system according to the present invention, the heat treatment of heating the structure to a temperature lower than the softening point of the first material portion to cause crystal growth of the second material portion with stress yield is conducted, so that deformation of the first material can be prevented. In addition, the same effects as those of the first method of producing a semiconductor system can also be expected. Namely, it is possible to contrive an improvement in initial characteristics and reliability of operation on a long-term basis, such as defects in conduction of the wiring material.

What is claimed is:

1. A method of forming a metallic film, comprising the steps of:

heating a metallic film to a first temperature of the stress yield point of the metal ±50° C. and holding said metallic film at said first temperature for a predetermined period of time, and heating said metallic film to a second temperature which is not lower than said first temperature and at which growth of crystal grain diameter of said metallic film occurs.

2. A method of producing a semiconductor system, comprising the steps of:

forming a metallic film to be used for wiring on an insulating film provided with a recessed portion so as to fill up said recessed portion, heating said metallic film to a first temperature of the stress yield point of the metal ±50° C. and holding said metallic film at said temperature for a predetermined period of time, and heating said metallic film to a second temperature which is not lower than said first temperature and at which growth of crystal grain diameter of said metallic film occurs.

3. A method of producing a semiconductor system, comprising:

a structural body that is heated;

a first material portion of said structural body which is softened when heated; and a second material portion of said structural body comprised of a metal based material and formed in contact with said first material portion, wherein said structural body is heated to a temperature lower than the softening point of said first material portion to thereby cause crystal growth of said second material portion with stress yield.

* * * * *